United States Patent [19]
Kyung et al.

[11] Patent Number: 5,650,977
[45] Date of Patent: Jul. 22, 1997

[54] INTEGRATED CIRCUIT MEMORY DEVICE INCLUDING BANKS OF MEMORY CELLS AND RELATED METHODS

[75] Inventors: Kye-Hyun Kyung, Ahnyang; Jei-Hwan Yoo, Suwon; Jin-Man Han, Seoul, all of Rep. of Korea

[73] Assignee: Samsung Electronics Co., Ltd., Suwon, Rep. of Korea

[21] Appl. No.: 637,425

[22] Filed: Apr. 25, 1996

[30] Foreign Application Priority Data

Apr. 25, 1995 [KR] Rep. of Korea ............... 1995-9782

[51] Int. Cl.$^6$ ................................................ G11C 8/00
[52] U.S. Cl. .............................. 368/230.03; 365/230.06
[58] Field of Search ........................ 365/189.02, 230.03, 365/230.06, 230.02, 230.08

[56] References Cited

U.S. PATENT DOCUMENTS

| | | | |
|---|---|---|---|
| 4,379,342 | 4/1983 | Nakano et al. | 365/230.03 |
| 4,744,061 | 5/1988 | Takamae et al. | 365/230.03 |
| 5,068,831 | 11/1991 | Hoshi et al. | 365/189.05 |
| 5,111,386 | 5/1992 | Fujishima et al. | 365/230.03 |
| 5,245,572 | 9/1993 | Kosonocky | 365/230.03 |
| 5,301,144 | 4/1994 | Kohno | 365/230.03 |
| 5,353,427 | 10/1994 | Fujishima | 365/230.03 |
| 5,428,574 | 6/1995 | Kuo et al. | 365/156 |

*Primary Examiner*—Tan T. Nguyen
*Attorney, Agent, or Firm*—Bell, Seltzer, Park & Gibson

[57] ABSTRACT

An integrated circuit memory device includes a plurality of memory cells, a plurality of data lines, a memory cell selector, and a memory cell connector. The memory cells are arranged in a matrix of rows and columns wherein the plurality of memory cells are further grouped in banks with each bank including at least two rows of memory cells. Each of the data lines extends along one of the columns of memory cells so that each of the data lines extends along memory cells from each of the banks of memory cells. The memory cell selector includes a row decoder which selects one of the plurality of rows, a column decoder which selects one of the plurality of columns, and a bank decoder which selects one of the banks. The connector connects one of the memory cells to a respective data line in response to the memory cell selector. Accordingly, data from only one of the memory cells is provided on a respective one of the data lines at any point and time.

21 Claims, 4 Drawing Sheets

INTEGRATED CIRCUIT MEMORY DEVICE INCLUDING BANKS OF MEMORY CELLS AND RELATED METHODS

FIELD OF THE INVENTION

The present invention relates to the field of integrated circuits and more particularly to the field of integrated circuit memory devices.

BACKGROUND OF THE INVENTION

Integrated circuit memory devices such as read only memories (ROMs), random access memories (RAMs) and various other types of integrated circuit memories are widely used in electronics systems. As shown in FIG. 1, an integrated circuit memory device includes a plurality of unit cell arrays UCA arranged in rows and columns, division word line driver blocks SWD located between columns of unit cell arrays, and sense amplifier blocks SAB located between unit cell arrays in a column. The row decoder RD selects and drives one word line WL responsive to a row address which is provided from the row address line RAL. All memory cells within the row associated with the selected word line WL change an electrical charge on an associated bit line BL upon selection. The change in electrical charge on each bit line depends on whether a one or a zero is stored in the associated memory cell. This change in electrical charge is amplified by a corresponding sense amplifier.

A column selection line CSL is selectively driven by a column decoder CD in response to a column address provided by the column address line CAL. Accordingly, when both the word line WL and the column selection line CSL for a predetermined memory cell are selected, data from that memory cell is amplified by the associated sense amplifier and transmitted to the associated data line DL.

As also shown in FIG. 1, one column selection line CSL drives eight unit cell arrays UCA in a column. Two bits of data can be transmitted from sense amplifiers to corresponding data lines responsive to the selection of one column selection line. When a column access operation is performed, 16 bits of data can be transmitted. Accordingly, if the memory device is designed to output four bits of data, the 16 bits generated can be multiplexed through four, 4×1 multiplexers MUX and coupled to the four input/output pads DP.

Dynamic random access memories may require a latency period after data is output by a data access operation of a row chain before a row access operation is performed due to row precharge in one bank. In order to reduce the latency period and thereby increase the speed of the memory, a dynamic random access memory can have a structure including a plurality of banks which reduce the latency period by outputting data from another bank. The effect of the latency period can be reduced as the number of banks is increased because the possibility that the same bank is consecutively accessed is reduced. Accordingly, the data access capacity of a dynamic random access memory can be increased by dividing the memory into a larger number of banks.

An integrated circuit memory device including banks of unit cell arrays is illustrated in FIG. 2. As shown, each bank includes independent address transmission units, row and column decoders, sense amplifiers, data transmission units, and memory cells. Accordingly, this division into banks causes an increase in the chip size of the memory device.

The memory cell array is divided into four banks B0–B3. Each bank has a row decoder RDL such as a latch storage row decoder, and a column decoder CD. If the latch storage row decoder RDL selects and drives the word line of the corresponding bank in response to a row address and a bank selection signal provided by the row address line RAL and the bank information line BIL, data from the memory cell connected to the word line is amplified through the bit line and sense amplifier. Address information is stored in the row decoder so that a current driving state can be maintained in the first selected bank by the word line already selected even though the row address operation is performed in the next selected bank while the word line of the first selected bank is driven. After the data from the memory cell is amplified by the sense amplifier, it is transmitted to the data line DL if the column address and the bank selection signals are applied to the column decoder through the column address line CAL and the bank information line BIL and the two selected column selection lines CSL are driven in a selected bank. Because two column selection lines CSL are driven in one selected bank, four bits of data can be output from one selected bank.

The memory device of FIG. 2, however, may require a greater number of latch storage row decoders RDL and division word line driver blocks SWD than the memory device of FIG. 1. Furthermore, the memory device of FIG. 2 may require that the row address line RAL and the bank information line BIL be extended between the banks of unit cell arrays. In addition, this memory device may require additional wiring in the form of a data bus DB wherein the data bus is used to connect the data lines from each bank to the respective input/output pad DP. Accordingly, the memory device of FIG. 2 may require a larger chip area per unit of memory when compared to the memory device of FIG. 1.

In addition, the distances between the data lines and the associated input/output pads DP are different for data lines within the same bank. For example, assuming that the distance between the i-th data line and the corresponding data pad DP is established as D0i in the bank B0, the distance between the j-th data line and the corresponding input/output pad DP is D0j, the distance between the k-th data line and the input/output pad DP is D0k, and the distance between the l-th data line and the input/output pad DP is D0l, the relationship therebetween is given as D0i≠D0j≠D0k≠D0l. As a result, line skew may result as data is transmitted across data lines of different lengths. Because the data transmission time is dependent on the length of the data line, the line skew may reduce or limit the speed at which data can be accessed.

SUMMARY OF THE INVENTION

It is therefore an object of the present invention to provide an improved integrated circuit memory device.

It is another object of the present invention to provide an integrated circuit memory device which allows high speed access to stored memory.

It is yet another object of the present invention to provide an integrated circuit memory device having reduced chip size.

It is still another object of the present invention to provide an integrated circuit memory device having reduced line skew.

These and other objects are provided according to the present invention by an integrated circuit memory device including a plurality of memory cells arranged in a matrix of rows and columns wherein the plurality of memory cells are further grouped in banks with each bank comprising at least two rows of memory cells. The memory device also includes a plurality of data lines wherein each of the data lines extends along one of the columns of memory cells so that each of the data lines extends along memory cells from each of the banks of memory cells.

Furthermore, connection means is provided which connects one of the memory cells to a respective data line responsive to selection of that memory cell so that data from only one of the memory cells is provided on a respective one of the data line at any point in time. In particular, a row decoder selects one of the plurality of rows of memory cells, a column detector selects one of the plurality of columns of the memory cells, and a bank decoder selects one of the banks of memory cells. Accordingly, the data access time can be reduced without requiring that row or column address lines be provided between banks of memory cells. This arrangement also allows the use of a single row control block.

The connection means may include a bank selection switch responsive to the bank decoder and a column selection switch responsive to the column decoder. In particular, the bank selection switch and the column selection switch can be connected in series between one of the memory cells and the respective data line. Accordingly, both the respective bank selection switch and column selection switch must be activated in order to connect the memory cell to the respective data line. A data line amplifier may also be included between the connection means and the data line.

The integrated circuit memory device can also include a multiplexer coupled to data lines from first and second columns of memory cells, and an input/output pad coupled to an output of the multiplexer. This arrangement allows multiple data lines to be multiplexed to a single input/output pad. A second multiplexer can be coupled to data lines from third and fourth columns of memory cells and a second input/output pad can be coupled to an output of the second multiplexer. In this arrangement, the data lines and the first and second multiplexers define electrical paths from each of the memory cells to respective input/output pads, and the electrical paths have respective path links so that a common path length exists between each of the memory cells in a common row and the respective input/output pads. Accordingly, line skew can be reduced.

Alternately, an integrated circuit memory device can include a plurality of memory cells arranged in a matrix of rows and columns wherein the plurality of memory cells are grouped in banks with each bank comprising at least two rows of the memory cells. A plurality of division word line driver blocks can be provided so that each of the columns of memory cells is separated by one of the division word line driver blocks. A plurality of sense amplifier blocks can be arranged so that each of the memory cells within each column is separated by one of the sense amplifier blocks. A row control block adjacent an edge column of the unit memory cells selects a row of memory cells and a bank of memory cells, and a column decoder selects a column of memory cells. A plurality of data lines can be arranged so that each of the data lines extends along one of the columns of memory cells and extends along memory cells from each of the banks of memory cells. Connection means connect one of memory cells to a respective data line responsive to the row control block and the column decoder so that data from only one of the memory cells is provided on a respective one of the data lines at any point and time.

The present invention also encompasses a method for obtaining data from an integrated circuit memory device. The integrated circuit memory device includes a plurality of memory cells arranged in a matrix of rows and columns wherein the plurality of memory cells are grouped in banks with each bank comprising at least two rows of memory cells. The memory device also includes a plurality of data lines wherein each of the data lines extends along one of the columns of memory cells so that each of the data lines extends along memory cells from each of the banks of memory cells. A method for obtaining data includes the steps of selecting one of the plurality of rows of memory cells, selecting one of the columns of memory cells, and selecting one of the banks of memory cells. One of the memory cells is connected to a respective data line in response to the selecting steps. Accordingly, data from only one of the memory cells is provided on a respective one of the data lines at any point and time.

The memory devices, systems, and methods of the present invention allow the reduction of data access time without requiring that row or column address lines be provided between banks and memory cells. The invention also allows the use of a single row control block outside the matrix of memory cells arranged in rows, columns and blocks.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements due out.

Figure 3:
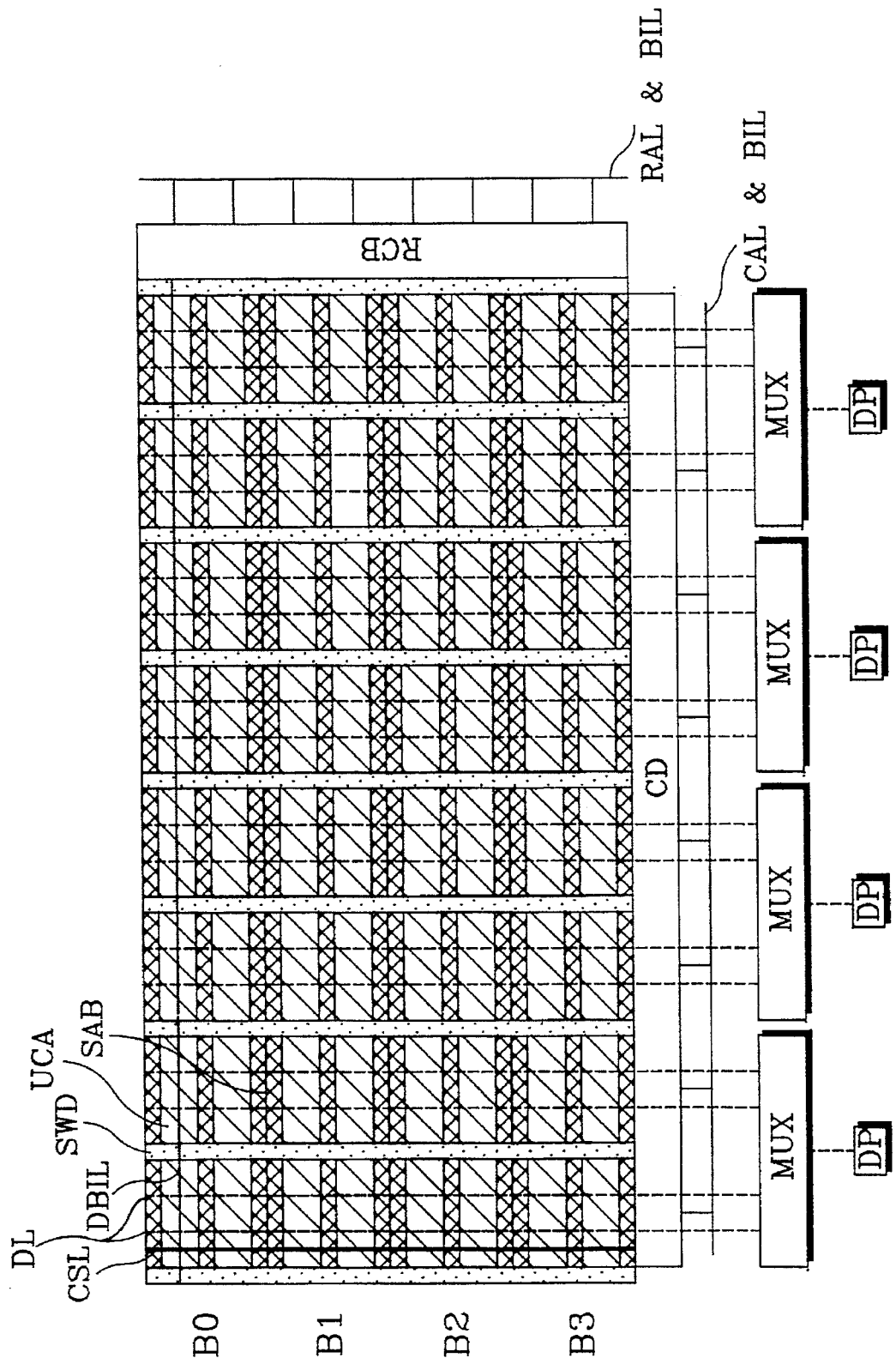
FIG. 3 is a block diagram showing an integrated circuit memory device according to the present invention.

Referring now to FIG. 3, a plurality of unit cell arrays UCA are arranged in a matrix of rows and columns. Division word line driver blocks SWD are arranged between the columns of unit cell arrays, and sense amplifier blocks SAB are arranged between the unit cell arrays of each column. The operation of the unit cell arrays, division word line driver blocks, and sense amplifiers will be understood by those having skill in the art. The unit cell arrays are further arranged into banks B0, B1, B2, and B3. As shown, each bank includes two rows of unit cell arrays. Furthermore, two sense amplifier blocks SAB separate adjacent unit cell arrays from different banks within the same column. Only a single row decoder is used, and this row decoder is located outside the matrix of unit cell arrays. The row decoder, referred to as a row control block RCB functions as a latch and bank information decoder as well as a conventional row decoder. A bank information decoding line DBIL is connected to the row control block RCB and extends along the upper side of the unit cell arrays UCA across a row. A decoding signal which is used to select banks is transmitted to the bank information decoding line DBIL.

Figure 1:
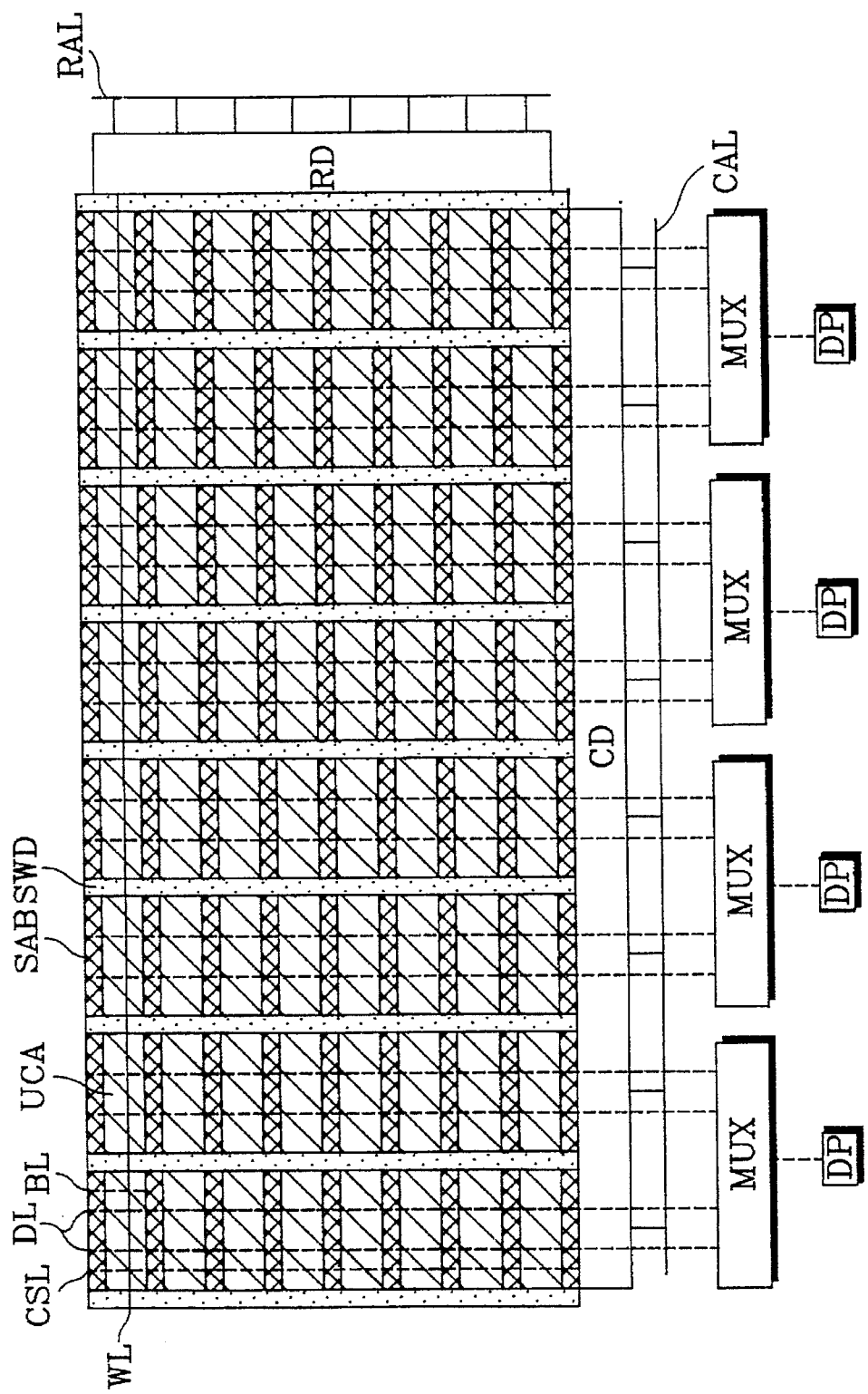
FIG. 1 is a block diagram showing a structure of an integrated circuit memory device according to the prior art.
Figure 2:
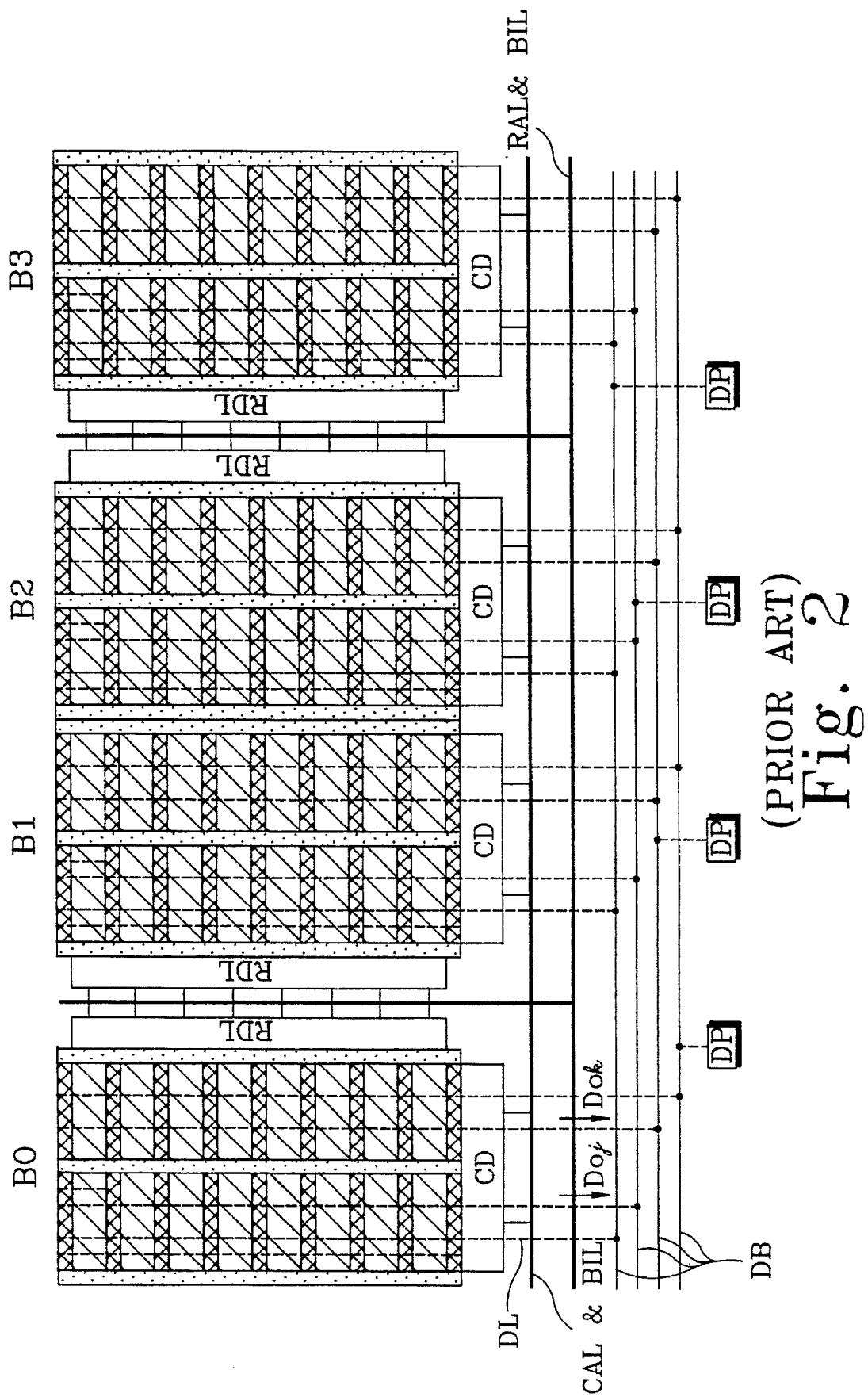
FIG. 2 is a block diagram showing an integrated circuit memory device including a plurality of banks according to the prior art.

The row control block RCB is connected to the row address line RAL and the bank information line BIL. The decoding signal is transmitted to the bank information decoding line DBIL in response to bank selection signals which are input through the bank information line BIL. The latch stored in the row control block RCB operates as discussed above with regard to FIG. 2. A column decoder CD is connected to the column address line CAL. The data lines of FIG. 3 are directly connected to the multiplexers MUX. As shown, the distances between the data lines and the data input/output pad DP are the same. Accordingly, line skew is reduced.

In the integrated circuit memory device of FIG. 3, each data line DL is shared with each of the banks of unit cell arrays. In order to process more data when the column access operation is once performed at high speed, one column selection line CSL can be used in each bank to drive a corresponding data line of two bits in one bank. Accordingly, if one column selection line CSL is at an activating state, the data is accessed by two bits for each CSL and eight bits of data in total can be transmitted to the data input/output pad DP through eight multiplexers, for example, operated as 2×1 multiplexers.

When the row control block RCB inputs the signals for the row address and bank selection from the row address line RAL and the bank information line BIL, and when the word line is driven in the selected bank, a charge on the corresponding bit line is changed by the data stored in the memory cell connected to the selected word line. A change in voltage resulting from the change in the charge on the bit line is amplified by the respective sense amplifier. After the data from the memory cell is amplified by the sense amplifier, eight selected column selection lines CSL and the bank information decoding lines DBIL for the selected bank are driven if the column address and the bank selection signals are applied to the column decoder and the row control block RCB through the column address line CAL and the bank information line BIL. Then, data from the bit line where the activated column selection lines CSL are connected to the bank information decoding lines DBIL is transmitted to the respective data line DL, and two bits of data are thus transmitted to the data line DL by one of the eight column selection lines CSL. Since the eight column selection lines CSL are driven in the memory array of FIG. 3, 16 bits of data are output from the one selected bank. Accordingly, it is possible to sequentially output a plurality of data read by using a shift register when the column access operation is once performed. The use of a shift register will be understood by those having skill in the art.

Figure 4A:
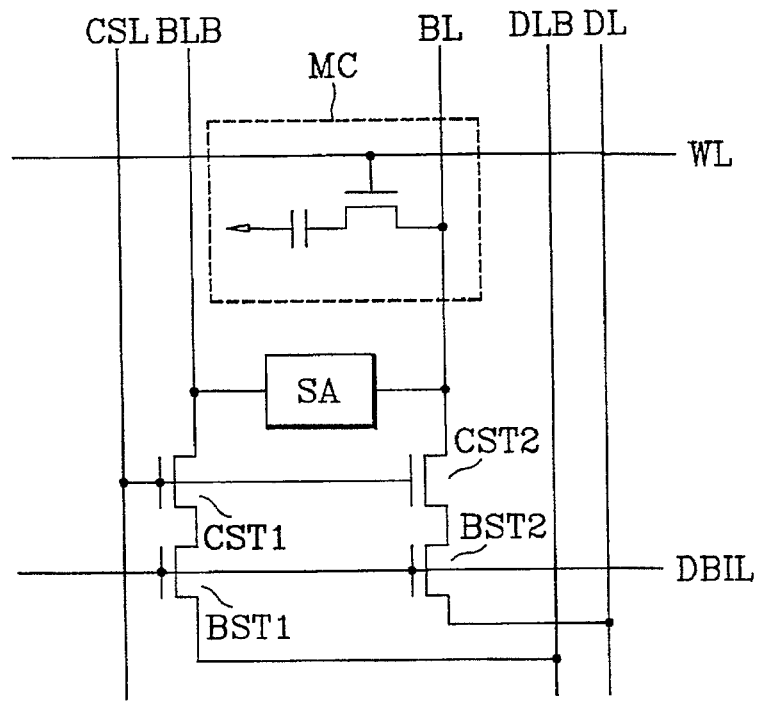
FIG. 4A is a schematic diagram showing a first structure for transmitting data from a memory cell to a data line in an integrated circuit memory device according to the present invention.
Figure 4B:
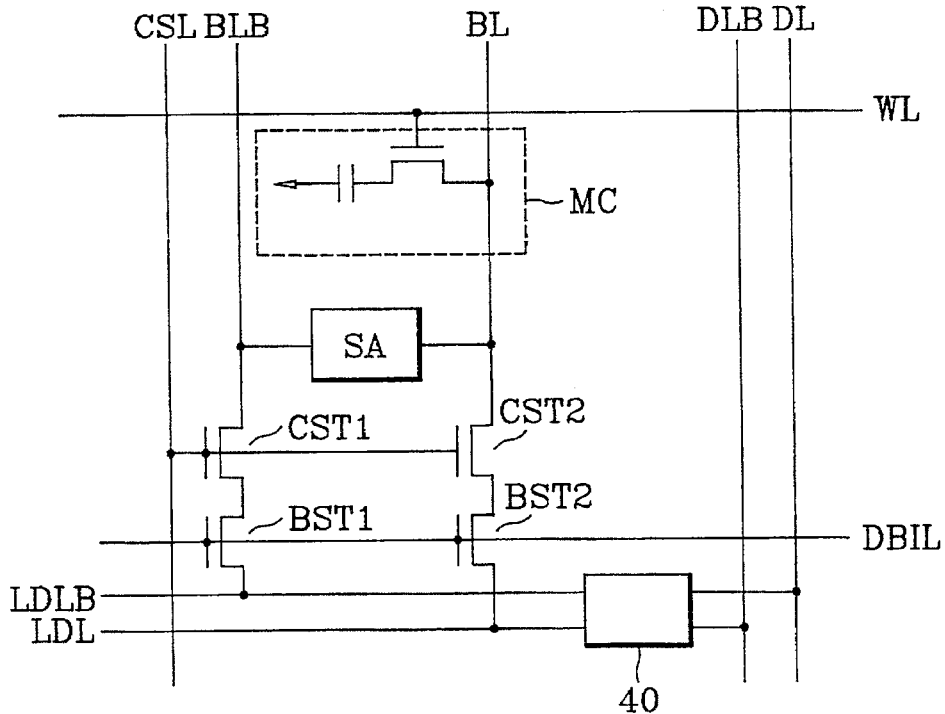
FIG. 4B is a schematic diagram showing a second structure for transmitting data from a memory cell to a data line in an integrated circuit memory device according to the present invention.

FIGS. 4A and 4B are schematic diagrams showing first and second structures for transmitting data of a selected memory cell MC to a respective data line DL in an integrated circuit memory device according to the present invention. In particular, a pair of column selection transistors CST1 and CST2 are connected in series with a pair of bank selection transistors BST1 and BST2. The first column selection transistor CST1 and the first bank selection transistor BST1 are connected in series between bit line BLB and data line DLB, while the series combination of the second column selection transistor CST2 and the second bank selection transistor BST2 are connected between bit line BL and data line DL. The gates of the column selection transistors CST1 and CST2 are commonly connected to the column selection line CSL, and the gates of the bank selection transistors BST1 and BST2 are commonly connected to the bank information decoding line DBIL. If one bit of data stored in the unit cell memory UCM is transmitted to the bit line BL by the selection of the word line WL through a charge sharing step, the one bit of data is amplified through the sense amplifier SA connected between the pair of bit lines BL and BLB and is then transmitted to the pair of data lines DL and DLB through the column selection transistors CST1 and CST2 and the bank selection transistors BST1 and BST2.

In FIG. 4B, the pair of bank selection transistors BST1 and BST2 are connected to a pair of local data lines LDL and LDLB which are in turn connected to a data line amplifier LDLB without being directly connected to the pair of data lines DL and DLB. The data line amplifier 40 is arranged between the pair of local data lines LDL and LDLB and the pair of data lines DL and DLB in order to amplify the data potential on the data line and to transmit the data potential to the data line.

In the memory device of the present invention, the columns of unit cell arrays are separated by division word line driver blocks and the row control block RCB can be provided outside the matrix of unit cell arrays. Accordingly, this memory device provides a plurality of banks of unit cell arrays without significantly increasing the size of the chip. Furthermore, the distance from each unit cell array along a respective data line to a respective input/output pad is the same for each unit cell array in a common row. Accordingly, line skew between data lines can be reduced. Thus, data access operations can be provided at high speed by processing the data read from a bank for one column access operation.

In the drawings and specification, there have been disclosed typical preferred embodiments of the invention and, although specific terms are employed, there are used in generic and descriptive sense only and not for purposes of limitation, the scope of the invention being set forth in the following claims.

That which is claimed:

1. An integrated circuit memory device comprising:
   a plurality of memory cells arranged in a matrix of rows and columns, wherein said plurality of memory cells are grouped in banks with each bank comprising at least two rows of said memory cells;
   a plurality of data lines wherein each of said data lines extends along one of said columns of memory cells so that each of said data lines extends along memory cells from each of said banks of memory cells;
   a row decoder which selects one of said plurality of rows of memory cells;
   a column decoder which selects one of said plurality of columns of memory cells;
   a bank decoder which selects one of said banks of memory cells; and
   connection means for connecting one of said memory cells to a respective data line responsive to said row decoder, said column decoder, and said bank decoder so that data from only one of said memory cells is provided on a respective one of said data lines at any point in time wherein said connection means comprises a bank selection switch responsive to said bank decoder and a column selection switch responsive to said column decoder.

2. An integrated circuit memory device according to claim 1 wherein said bank selection switch and said column selection switch are connected in series between one of said memory cells and said respective data line.

3. An integrated circuit memory device according to claim 1 further comprising:
   a multiplexer coupled to data lines from first and second columns of memory cells; and
   an input/output pad coupled to an output of said multiplexer.

4. An integrated circuit memory device according to claim 3 further comprising:
   a second multiplexer coupled to data lines from third and fourth columns of memory cells; and
   a second input/output pad coupled to an output of said second multiplexer;
   wherein said data lines and said first and second multiplexers define electrical paths from each of said memory cells to respective input/output pads, said electrical paths having respective path lengths, so that a common path length exists between each of said memory cells in a common row and said respective input/output pads.

5. An integrated circuit memory device according to claim 1 further comprising a plurality of sense amplifiers arranged between memory cells in a column.

6. An integrated circuit memory device according to claim 1 further comprising a plurality of division word line driver blocks arranged between said columns of memory cells.

7. An integrated circuit memory device comprising:
   a plurality of memory cells arranged in a matrix of rows and columns, wherein said plurality of memory cells are grouped in banks with each bank comprising at least two rows of said memory cells;
   a plurality of data lines wherein each of said data lines extends along one of said columns of memory cells so that each of said data lines extends along memory cells from each of said banks of memory cells;
   a row decoder which selects one of said plurality of rows of memory cells;
   a column decoder which selects one of said plurality of columns of memory cells;
   a bank decoder which selects one of said banks of memory cells;
   connection means for connecting one of said memory cells to a respective data line responsive to said row decoder, said column decoder, and said bank decoder so that data from only one of said memory cells is provided on a respective one of said data lines at any point in time; and
   a data line amplifier between said connection means and said data line.

8. A memory cell selection system for a semiconductor memory device having a plurality of unit cell arrays arranged in a matrix of rows and columns, a plurality of sense amplifiers arranged between unit cell arrays within each of said columns, and a plurality of division word driver blocks arranged between said columns of unit cell arrays, said memory cell selection system comprising:
   a plurality of banks of unit cell arrays wherein each of said banks comprises at least two rows of unit cell arrays;
   a row decoder for selecting one of a plurality of rows of unit cell arrays from each of said banks;
   a column decoder for selecting a column of unit cell arrays;
   a bank decoder for selecting a bank of unit cell arrays; and
   a plurality of data lines wherein each of said data lines extends along a respective column of unit cell arrays so that each of said data lines extends along unit cell arrays from at least two of said banks of unit cell arrays;
   wherein each of said unit cell arrays comprises a bit line and wherein said bit line is connected to a respective data line through switching means which is responsive to said bank decoder and said column decoder and wherein said switching means comprises a bank switch responsive to said bank decoder and a column switch responsive to said column decoder.

9. A memory cell selection system for a semiconductor memory device according to claim 8 wherein said bank switch and said column switch are connected in series, wherein said bank switch is coupled to said bank decoder through a bank information decoding line and wherein said column switch is coupled to said column decoder through a column selection line.

10. A memory cell selection system for a semiconductor memory device according to claim 8 further comprising at least one data input/output pad coupled to data lines from at least two of said columns of unit cell arrays.

11. A memory cell selection system for a semiconductor memory device according to claim 10 further comprising a multiplexer wherein said data lines from said at least two of said columns of unit cell arrays are coupled to inputs of said multiplexer and an output of said multiplexer is coupled to said data input/output pad.

12. A memory cell selection system for a semiconductor memory device having a plurality of unit cell arrays arranged in a matrix of rows and columns, a plurality of sense amplifiers arranged between unit cell arrays within each of said columns, and a plurality of division word driver blocks arranged between said columns of unit cell arrays, said memory cell selection system comprising:
   a plurality of banks of unit cell arrays wherein each of said banks comprises at least two rows of unit cell arrays;
   a row decoder for selecting one of a plurality of rows of unit cell arrays from each of said banks;
   a column decoder for selecting a column of unit cell arrays;
   a bank decoder for selecting a bank of unit cell arrays; and
   a plurality of data lines wherein each of said data lines extends along a respective column of unit cell arrays so that each of said data lines extends along unit cell arrays from at least two of said banks of unit cell arrays; and
   wherein each of said unit cell arrays comprises a bit line and wherein said bit line is connected to a respective data line through switching means which is responsive to said row decoder, said bank decoder, and said column decoder and wherein each of said unit cell arrays further comprises an amplifier between said data line and said switching means.

13. An integrated circuit memory device comprising:
   a plurality of memory cells arranged in a matrix of rows and columns, wherein said plurality of memory cells are grouped in banks with each bank comprising at least two rows of said memory cells;
   a plurality of division word line driver blocks, wherein each of said columns of said memory cells is separated by one of said division word line driver blocks;
   a plurality of sense amplifier blocks, wherein each of said memory cells within each column is separated by one of said sense amplifier blocks;

a row control block adjacent an edge column of unit memory cells for selecting a row of memory cells and a bank of memory cells;

a column decoder for selecting a column of memory cells;

a plurality of data lines wherein each of said data lines extends along one of said columns of memory cells so that each of said data lines extends along memory cells from each of said banks of memory cells; and connection means for connecting one of said memory cells to a respective data line responsive to said row block control and said column decoder so that data from only one of said memory cells is provided on a respective one of said data lines at any point in time wherein said connection means comprises a bank selection switch responsive to said bank decoder and a column selection switch responsive to said column decoder.

14. An integrated circuit memory device according to claim 13 wherein adjacent memory cells within a column and from different banks are separated by two sense amplifier blocks.

15. An integrated circuit memory device according to claim 13 further comprising:

at least one multiplexer having inputs connected to data lines from at least two of said columns of said memory cells and having an output for passing data from one of said data lines at a time; and a data input/output pad electrically coupled to said multiplexer.

16. An integrated circuit memory device according to claim 13 wherein said matrix of memory cells comprises an even number of rows and columns of memory cells, and wherein each of said banks of memory cells includes two rows.

17. An integrated circuit memory device according to claim 13 wherein said bank selection switch and said column selection switch are connected in series between one of said memory cells and said respective data line.

18. A method for obtaining data from an integrated circuit memory device comprising a plurality of memory cells arranged in a matrix of rows and columns wherein said plurality of memory cells are grouped in banks with each bank comprising at least two rows of said memory cells, and a plurality of data lines wherein each of said data lines extends along one of said columns of memory cells so that each of said data lines extends along memory cells from each of said banks of memory cells, said method comprising the steps of:

selecting one of said plurality of rows of memory cells;

selecting one of said columns of memory cells;

selecting one of said banks of memory cells; and connecting one of said memory cells to a respective data line in response to said selecting steps, so that data from only one of said memory cells is provided on a respective one of said data lines at any point in time wherein said connecting step comprises connecting one of said memory cells to said respective data line through a respective bank selection switch responsive to said selected bank and through a respective column selection switch responsive to said selected column.

19. A method according to claim 18 further comprising the step of:

multiplexing at least two of said data lines to a common input/output pad so that data from only one of said data lines is provided to said input/output pad at a time.

20. A method according to claim 18 further comprising the step of:

amplifying said data from said connected memory cell.

21. A method according to claim 18 wherein said bank selection switch and said column selection switch are connected in series between one of said memory cells and said respective data line.

* * * * *